(12) United States Patent
Lim

(10) Patent No.: US 7,948,329 B2
(45) Date of Patent: May 24, 2011

(54) OSCILLATOR GAIN CIRCUIT AND METHOD

(75) Inventor: Hong Sair Lim, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 12/116,178

(22) Filed: May 6, 2008

(65) Prior Publication Data

US 2009/0278612 A1    Nov. 12, 2009

(51) Int. Cl.
*H03L 5/02*    (2006.01)
(52) U.S. Cl. .................. 331/160; 331/183; 331/186
(58) Field of Classification Search ............. 331/158, 331/160, 183, 186
See application file for complete search history.

(56) References Cited

U.S. PATENT DOCUMENTS

| | | | |
|---|---|---|---|
| 3,725,822 A | 4/1973 | Eaton, Jr. et al. | |
| 3,935,546 A | 1/1976 | Morozumi et al. | |
| 6,091,307 A * | 7/2000 | Nelson .................. | 331/109 |
| 6,320,473 B1 | 11/2001 | Leuschner | |
| 6,819,196 B2 * | 11/2004 | Lovelace et al. ............ | 331/183 |
| 6,946,923 B2 | 9/2005 | Knickerbocker, Jr. et al. | |
| 7,522,010 B2 * | 4/2009 | Liang et al. .................. | 331/185 |
| 2003/0076902 A1 | 4/2003 | Yuan | |

FOREIGN PATENT DOCUMENTS

| | | |
|---|---|---|
| EP | 1073201 | 1/2001 |
| EP | 1589662 | 10/2005 |
| JP | 54150059 | 11/1979 |
| JP | 59032206 | 2/1984 |
| JP | 59194464 | 11/1984 |
| JP | 61216523 | 9/1986 |
| JP | 1044106 | 2/1989 |

OTHER PUBLICATIONS

Mark A. Unkrich et al., Conditions for Start-Up in Crystal Oscillators, IEEE Journal of Solid-State Circuits, Feb. 1982, p. 87-90, vol. SC-17, No. 1.
Eric A. Vittoz et al., High-Performance Crystal Oscillator Circuits: Theory and Application, IEEE Journal of Solid-State Circuits, Jun. 1988, p. 774-783, vol. 23, No. 3.
Andreas Rusznyak, Start-Up Time of CMOS Oscillators, IEEE Transactions on Circuits and Systems, Mar. 1987, p. 259-268, vol. CAS-34, No. 3.

* cited by examiner

*Primary Examiner* — Robert Pascal
*Assistant Examiner* — James E Goodley
(74) *Attorney, Agent, or Firm* — Horizon IP Pte Ltd

(57) ABSTRACT

A gain circuit of an oscillator circuit includes an inverter portion having an input IN and an output OUT arranged for connection to an external feedback circuit comprising a pi network. A feedback member having a first resistive element is coupled between the input IN and output OUT. An offset sense and correction block (OSCB) is configured to detect a dc offset potential difference between said input IN and output OUT and to reduce the offset potential by supplying a current to said input IN.

25 Claims, 7 Drawing Sheets

US 7,948,329 B2

OSCILLATOR GAIN CIRCUIT AND METHOD

FIELD OF THE INVENTION

The present invention relates to a gain circuit of an oscillator circuit and to a method of controlling such a circuit.

BACKGROUND OF THE INVENTION

Oscillator circuits are used in a wide range of applications including digital electronic circuits to generate clock signals. A two-terminal Pierce-type oscillator is one of the most frequently used clock signal generator circuits.

A two-terminal Pierce-type oscillator circuit is shown schematically in FIG. 1. The circuit is in the form of an on-chip gain circuit 10 connected to an external feedback circuit 50. The on-chip gain circuit 10 has an inverter circuit I that is arranged to provide amplification and a phase shift of substantially 180° between an input IN of the inverter and an output OUT of the inverter.

The external feedback circuit 50 is in the form of a pi network provided by a crystal Q, capacitors C1 and C2 and resistor $R_d$. The pi network is arranged to provide a phase shift of 180° (pi radians) between input and output terminals of the feedback circuit 50. The input and output terminals of the feedback circuit 50 are connected to the output OUT and input IN terminals of the gain circuit 10, respectively. A total phase shift of 360° is therefore provided by the gain circuit 10 in combination with the external feedback circuit 50. Provided that the closed loop gain of the oscillator circuit is greater than or equal to unity, sustainable oscillations can be established.

A feedback resistor RF feeds a potential at the output OUT of the inverter I back to the input IN so as to bias the inverter to a high gain linear region of operation. The dc bias potential of the inverter input and inverter output are therefore maintained substantially equal.

Resistor $R_d$ is provided in order to limit the output of the inverter such that the crystal is not overdriven. $R_d$ and C2 also form a low pass filter arranged to reduce spurious high frequency oscillation.

An implementation of the oscillator circuit of FIG. 1 is shown schematically in FIG. 2. A metal oxide semiconductor field effect transistor (MOSFET) transistor pair MP1, MN1 have their source and drain electrodes connected in series between voltage nodes $V_{dd}$ and gnd. Transistors MP1 and MN1 form an inverter whose input IN is connected to the gate electrodes of the transistors and whose output OUT is connected to a junction between the source and drain electrodes of the transistors. The input IN of the inverter corresponds to an input of the gain circuit 110 whilst the output OUT of the inverter corresponds to an output of the gain circuit 110. Input IN and output OUT are connected to capacitors C1 and C2 respectively, which are in turn connected to gnd.

A feedback resistance RF is connected between the input IN and output OUT as discussed with respect to FIG. 1. Feedback resistance RF is arranged to bias the inverter into a linear amplification region of operation.

As CMOS technology continues to scale to sub-100 nm feature sizes, it is found that in certain circumstances oscillator performance is adversely affected. In some cases, oscillator circuits are unable to commence oscillation when power is supplied to the circuit.

SUMMARY OF THE INVENTION

It is an object of the present invention to at least partly mitigate at least one of the above-mentioned problems.

It is a further object of some embodiments of the invention to provide an improved on-chip amplifier circuit for an oscillator circuit.

In a first aspect of the invention, there is provided a gain circuit of an oscillator circuit comprising: an inverter portion having an input IN and an output OUT arranged for connection to an external feedback circuit comprising a pi network; and a feedback member comprising a first resistive element coupled between said input IN and said output OUT; the circuit further comprising an offset sense and correction block (OSCB) configured to detect a dc offset potential difference between said input IN and output OUT, said OSCB being further configured to reduce said offset potential by supplying a current to said input IN.

In a second aspect of the present invention there is provided an integrated circuit having at least a portion comprising a gain circuit, said gain circuit comprising: an inverter portion having an input IN and an output OUT arranged for connection to an external feedback circuit comprising a pi network thereby to form an oscillator circuit, said inverter portion comprising a PFET device and an NFET device coupled in series via said output OUT, a source electrode of said PFET device being coupled to a first power supply terminal, a source electrode of said NFET device being coupled to a second power supply terminal and drain electrodes of said devices being coupled to said output OUT; and a feedback portion comprising a resistive portion coupled between said input IN and said output OUT, said circuit further comprising an offset sense and correction block (OSCB) configured to detect a dc offset potential difference between said input IN and output OUT, said OSCB being further configured to reduce said dc offset potential by supplying a current to said input IN, wherein said OSCB comprises an NFET device, a gate of said NFET device being coupled to said output OUT and a source electrode of said NFET device being coupled to said input IN.

In a third aspect of the invention there is provided a method of controlling a gain circuit of an oscillator circuit, said gain circuit having an input IN and an output OUT arranged for connection to a feedback circuit comprising a pi network, said circuit further comprising a feedback member coupled between said input IN and output OUT, said method comprising said steps of: detecting a dc offset potential difference between said input IN and output OUT; and supplying a current to said inverter input IN thereby to reduce said dc offset potential difference.

The present inventors have recognised that as CMOS technology continues to scale beyond 100 nm feature sizes, leakage current associated with devices in an off state can no longer be ignored in assessing circuit operation and performance.

For example, electrostatic discharge (ESD) devices connected to pads of an integrated circuit are a potential source of leakage current at the pads. ESD devices are provided in order to protect a circuit from damage due to electrostatic discharge. Since both the input IN and output OUT of the inverter circuit are connected to respective pads of an integrated circuit, sub-threshold leakage current may be present at these pads due to the presence of ESD devices or other sources of sub-threshold leakage current.

The sub-threshold leakage current, in combination with additional current that may be present at the pads due for example to the presence of moisture, can result in the establishment of a DC offset between the input IN and output OUT of the inverter. The DC offset causes an asymmetric bias of the oscillator stage that can adversely affect startup of the oscillator; in certain circumstances the DC offset conditions may be sufficient to prevent oscillation.

Grounded gate NMOS (GGNMOS) devices and gate coupled NMOS (GCNMOS) devices are examples of ESD protection devices that may draw the sub-threshold current described above.

BRIEF DESCRIPTION OF THE DRAWINGS

Embodiments of the present invention will now be described hereinafter, by way of example only, with reference to the accompanying drawings, in which.

DETAILED DESCRIPTION OF THE INVENTION

The following embodiments are intended to illustrate the invention more fully without limiting their scope, since numerous modifications and variations will be apparent to those skilled in the art.

Figure 3:
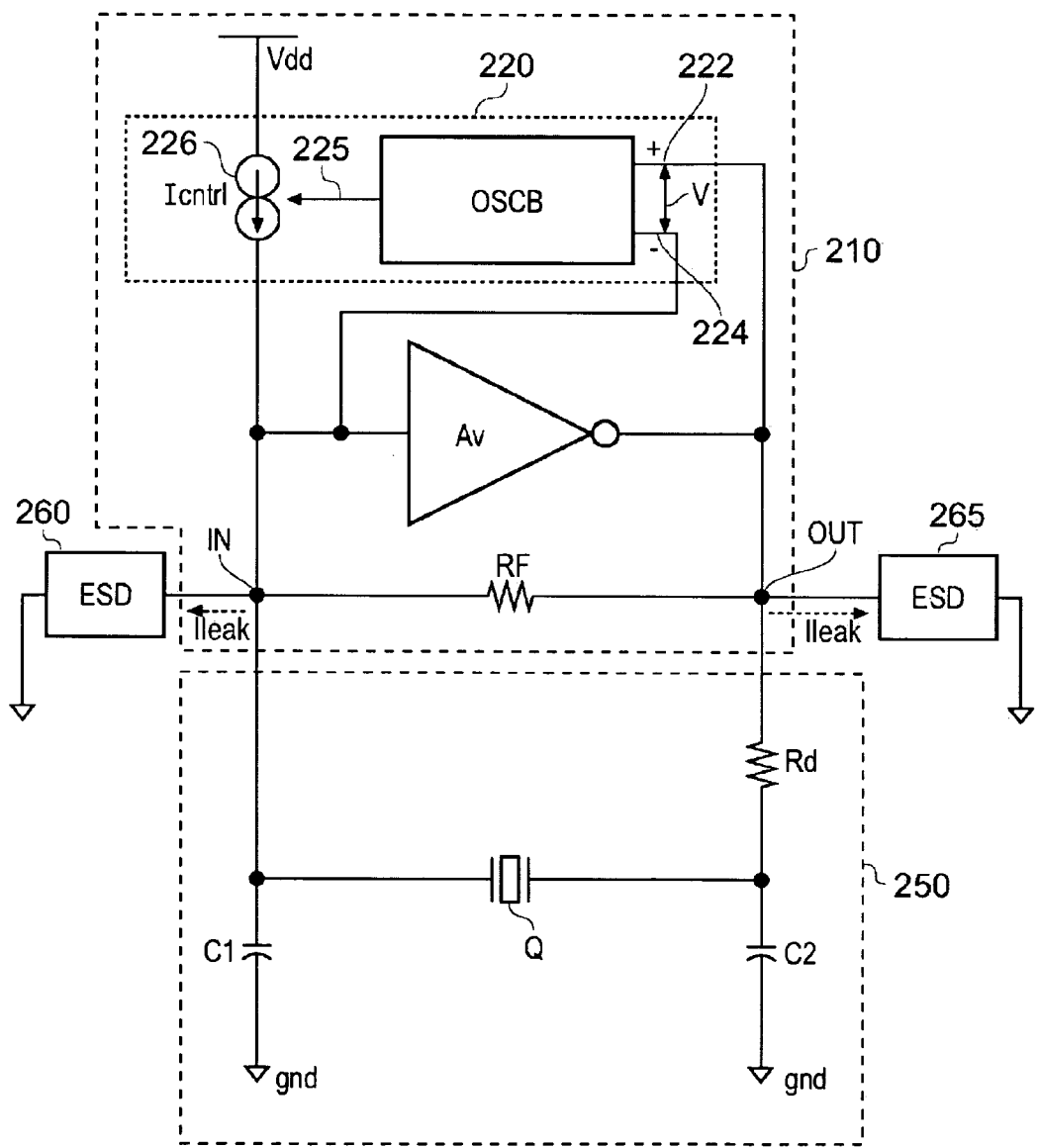
FIGS. 3 and 4 are schematic diagrams of a crystal oscillator circuit having a gain portion according to an embodiment of the invention.

FIG. 3 is a schematic diagram of a crystal oscillator circuit in accordance with one embodiment of the invention. The oscillator, as shown, comprises a pi circuit 250 and a gain circuit or portion 210 coupled thereto. In one embodiment, the gain circuit is formed on or integrated into a chip (on-chip) while the pi circuit is external to the chip (off-chip). Other configurations of gain and pi circuits are also useful.

In one embodiment, the gain portion 210 comprises input and output terminals IN and OUT. The input and output terminals are coupled to the external pi circuit which forms a feedback loop. The pi or feedback circuit, in one embodiment comprises a crystal Q, capacitors C1 and C2 and resistor $R_d$. The feedback circuit 250, for example, is similar to the feedback circuits 50, 150 of FIG. 1 and FIG. 2. Other types of pi circuits are also useful.

Figure 1:
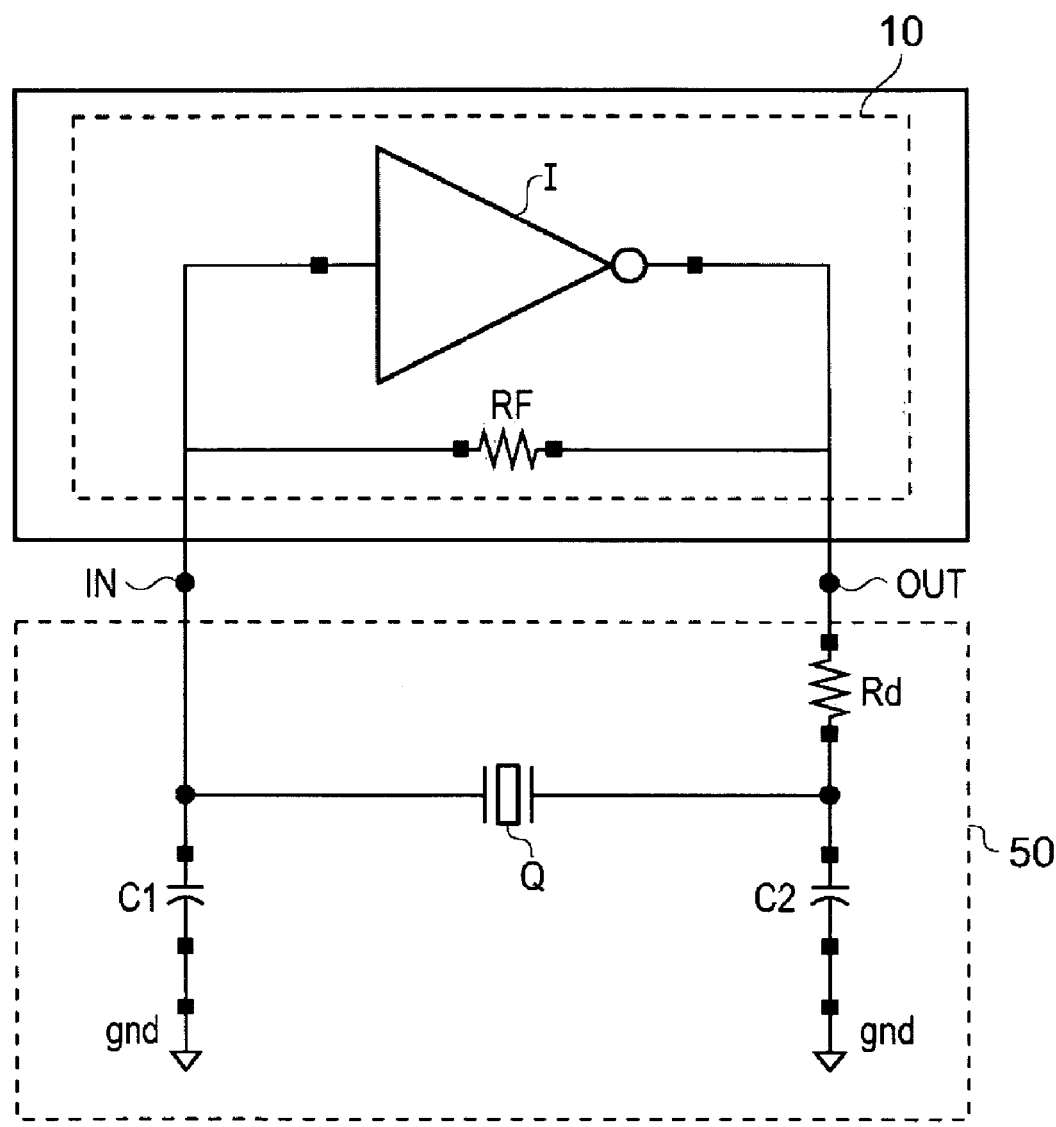
FIG. 1 is a schematic diagram of a prior art Pierce-type oscillator circuit.
Figure 2:
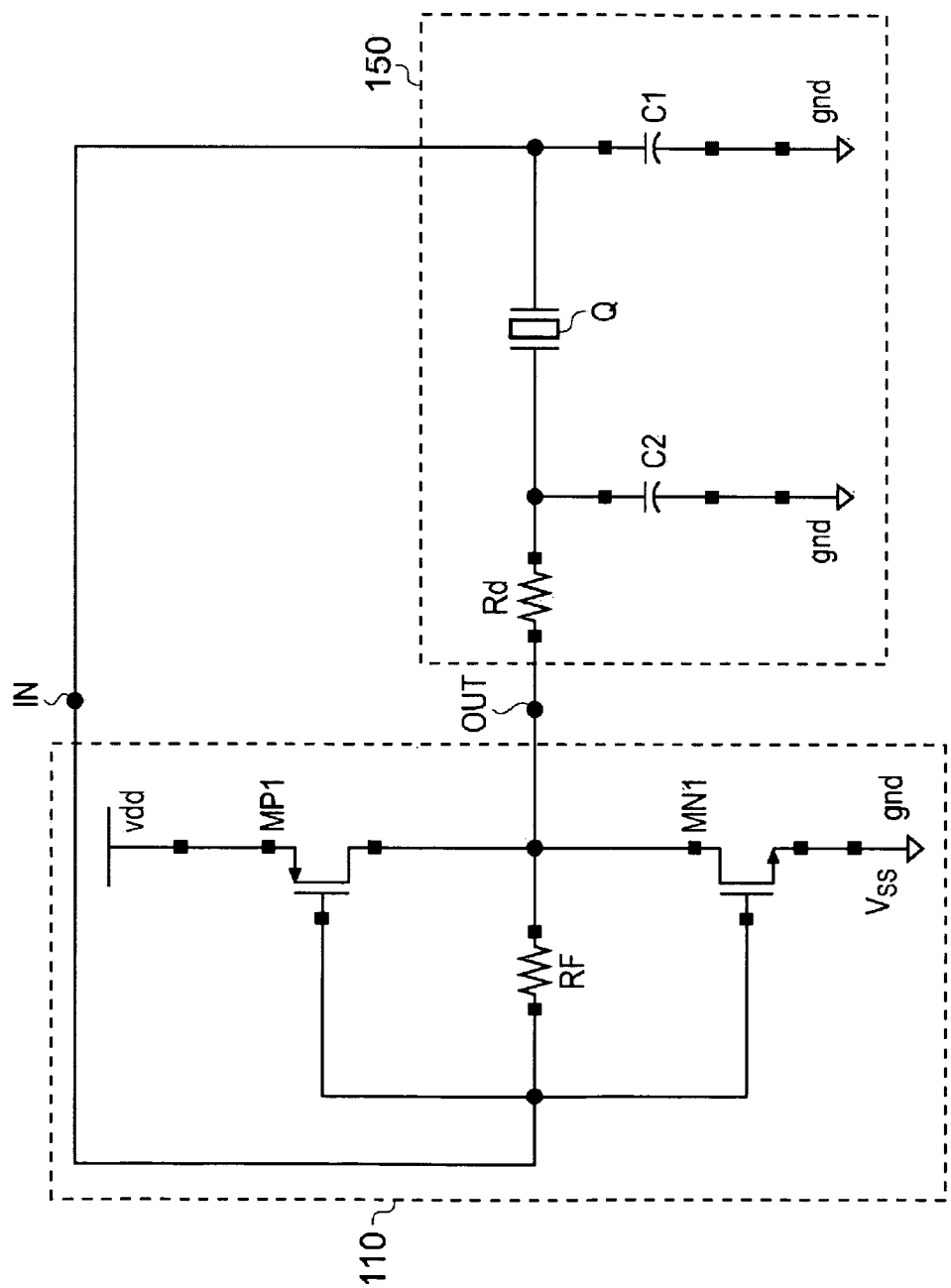
FIG. 2 is a schematic diagram of a prior art Pierce-type oscillator circuit showing components of an inverter circuit.

In one embodiment, the gain portion 210 is similar to the gain portions 10, 110 of the circuits of FIG. 1 and FIG. 2. For example, the gain portion comprises an inverter having input and output terminals coupled to the IN and OUT terminals. A resistor RF is coupled between the IN and OUT terminals. Other types of gain portions or circuits are also useful. ESD devices 260, 265 are connected respectively to the input IN and output OUT of the inverter circuit. In accordance with one embodiment of the invention, the gain portion comprises an offset sense and correction block (OSCB) 220 coupled to the inverter. In one embodiment, the OSCB 220 has a pair of inputs 222, 224 connected respectively to the output OUT and input IN of the inverter circuit. An output 225 of the OSCB 220 is connected to the input IN of the inverter circuit.

The OSCB 220 is arranged to detect a potential difference $V_{OUT}-V_{IN}$ between the output OUT and input IN of the inverter circuit (where $V_{OUT}$ is the electric potential at the output OUT and $V_{IN}$ is the electric potential at the input IN) and to apply a current $I_{cntrl}$ 226 to the input IN so as to reduce the potential difference $V_{OUT}-V_{IN}$.

In some embodiments, the OSCB 220 is arranged to reduce the potential difference $V_{OUT}-V_{IN}$ to substantially zero. Thus, the OSCB 220 acts to provide a negative feedback to reduce the magnitude of $V_{OUT}-V_{IN}$.

Figure 4:
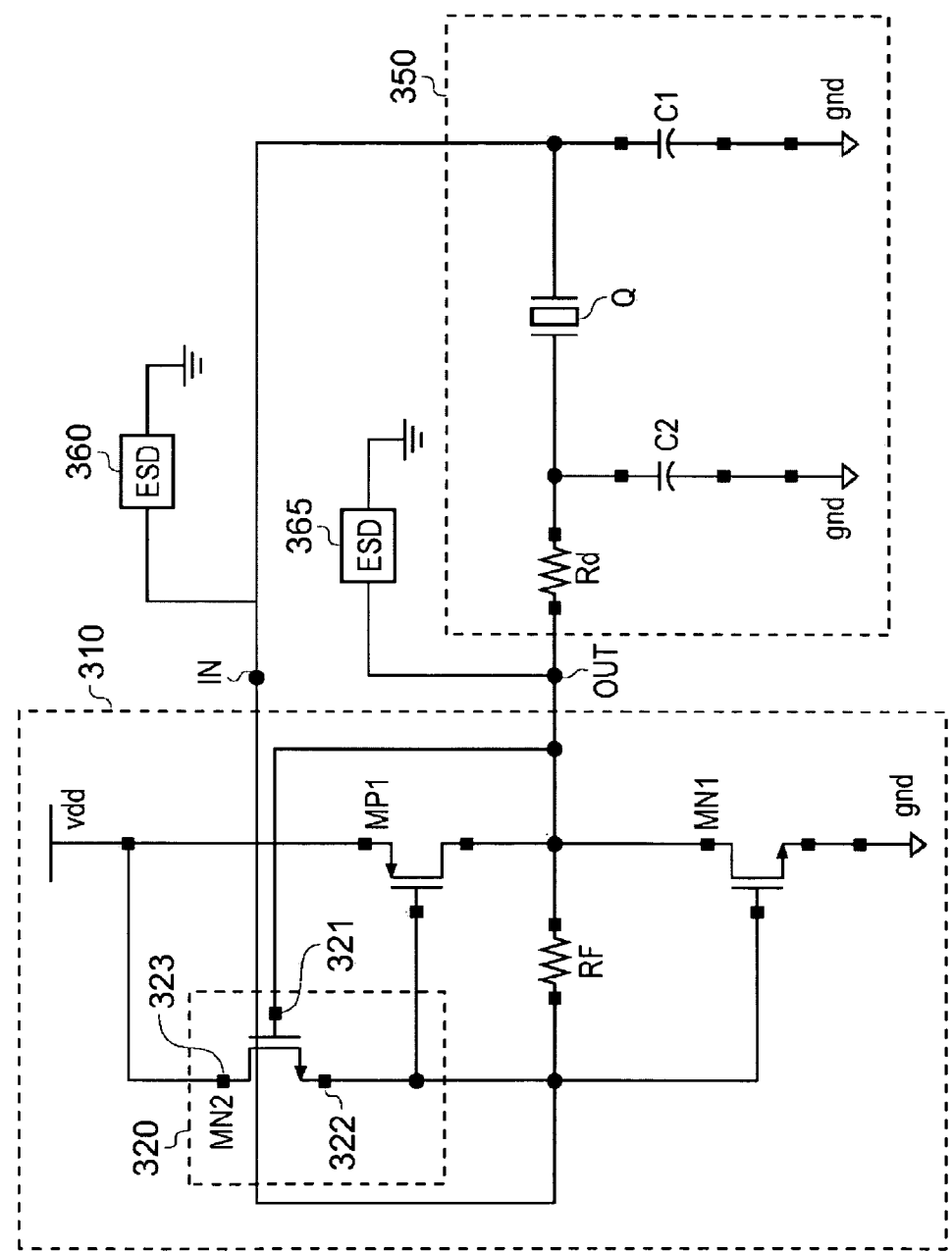

FIG. 4 shows a circuit according to an embodiment of the invention having a gain portion 310 and a feedback circuit 350. The gain portion includes an inverter provided by transistors MP1 and MN1. The circuit has an OSCB 320 provided by transistor MN2. Transistor MN2 in the embodiment of FIG. 4 is an N-channel MOSFET device. Other devices are also useful.

ESD devices 360, 365 are connected respectively to the input IN and output OUT of the inverter circuit.

As can be seen from FIG. 4, a gate electrode 321 of MN2 is connected to the output OUT of the inverter circuit whilst a source electrode 322 of MN2 is connected to the input IN of the inverter circuit. A drain electrode 323 of MN2 is connected to power source $V_{dd}$.

In operation, in the event that sub-threshold leakage current $I_{leak}$ is drawn by an ESD device from the input IN, leakage current $I_{leak}$ flows from the output OUT through RF to develop a dc offset potential difference $V_{OUT}-V_{IN}$ across RF. The dc offset potential difference is therefore generally always positive at the output OUT.

Since RF is usually large (of the order of one or more megaohms), $V_{OUT}-V_{IN}$ can be significant.

The dc offset potential difference is detected by the OSCB 320 as a potential difference between the gate electrode and source electrode $V_{gs}=V_{OUT}-V_{IN}$ of MN2. A positive (non-zero) value of $V_{gs}$ causes a current $I_{cntrl}$ to flow from $V_{dd}$ to the input IN, thereby causing the potential of input IN to rise. This has the effect that $V_{OUT}-V_{IN}$ is reduced.

It is noted that leakage current at the output OUT generally does not cause DC offset. Rather, such a current is typically drawn from transistor MP1, current which would otherwise flow to transistor MN1. The gain of the inverter is however thereby reduced.

Figure 5:
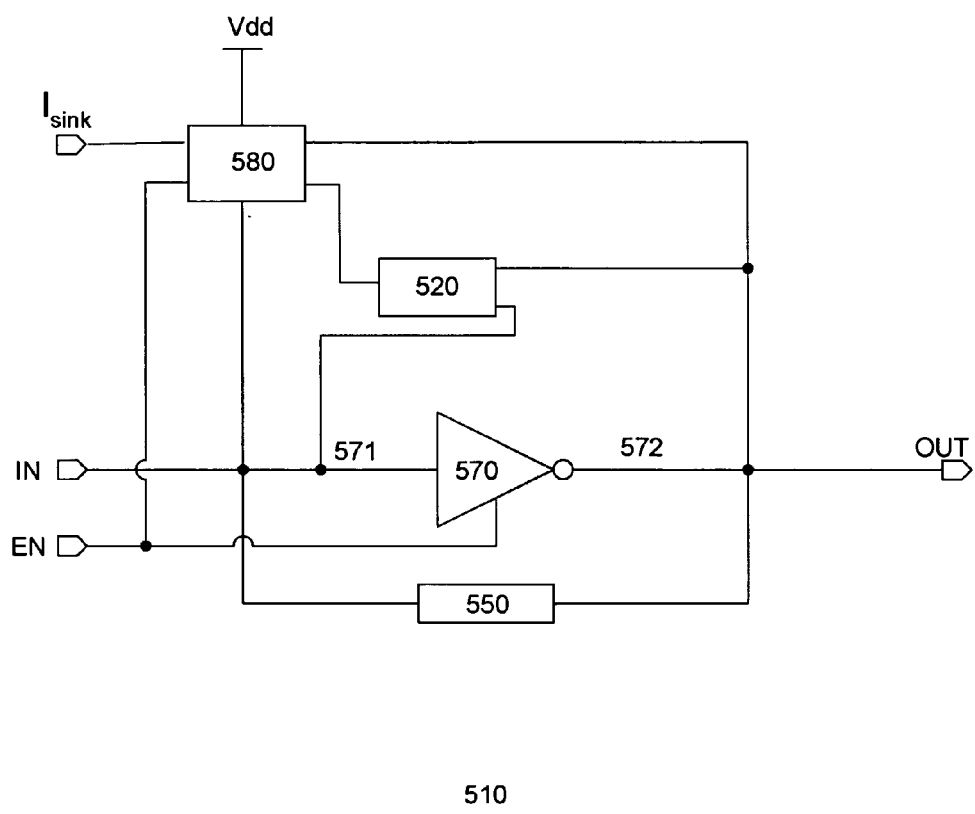
FIG. 5 is a schematic diagram of a gain portion of a crystal oscillator circuit according to an embodiment of the invention.

FIG. 5 shows a gain portion 510 in accordance with another embodiment of the invention. As shown, the gain portion comprises an inverter 570 having input and output terminals 571 and 572. The gain input IN is coupled to the inverter input terminal and gain output OUT is coupled to the inverter output terminal. The gain portion includes an EN terminal. The EN terminal provides an enable signal to activate the gain portion. The EN terminal, in one embodiment, is coupled to the inverter. A feedback sub-circuit 550 coupled to the inverter input and output terminals is provided. In one embodiment, the feedback sub-circuit comprises a resistor. Other types of feedback sub-circuits are also useful.

A current module 580 is provided for the gain portion. The current module is coupled to a power supply $V_{dd}$ of the gain portion. Additionally, the current module is coupled to both the input and output terminals of the inverter as well as the EN terminal. An input current $I_{sink}$ is provided to the current module. The input current, for example, is a constant current for biasing the gain portion.

In accordance with one embodiment of the invention, coupling the current source to the output terminal provides additional current path to increase bias currents during current sourcing. This increases the current sourcing capability of the circuit.

In accordance with one embodiment of the invention, the gain portion includes an OSCB 520. The OSCB is coupled to the input and output terminals of the gain portion as well as the current source. In one embodiment, the OSCB comprises input terminals coupled to the input and output terminals of the gain portion and an output terminal coupled to the current source. The OSCB reduces a potential difference between the OUT and IN terminals of the gain circuit. Additionally, the OSCB dynamically limits the peak amplitude of the oscillator output swing.

Figure 6:
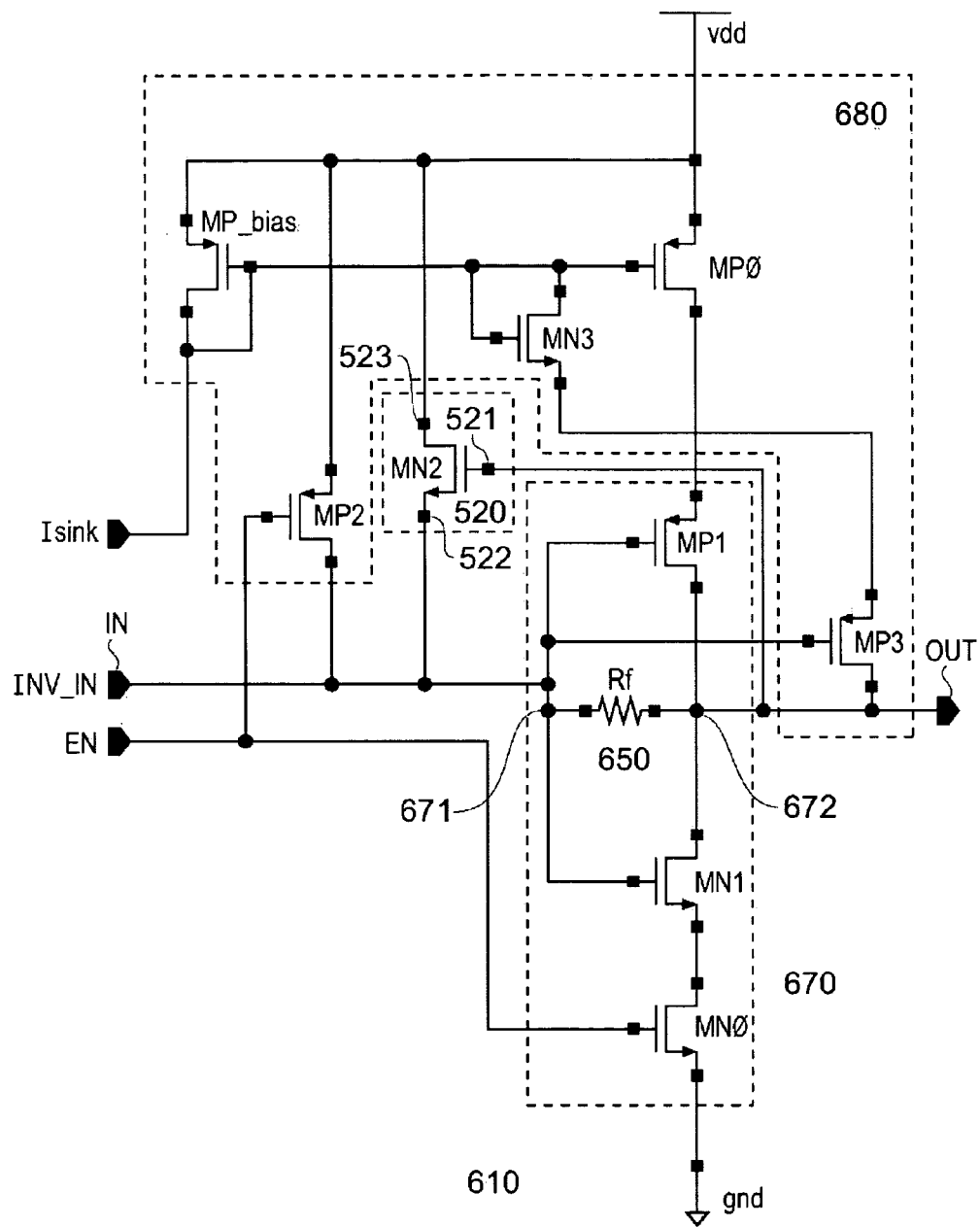
FIG. 6 is a schematic diagram of a gain portion of a crystal oscillator circuit according to an embodiment of the invention.

FIG. 6 shows a gain portion 610 in accordance with one embodiment of the invention. As shown, the gain portion includes an input terminal IN and output terminal OUT. An inverter 670 including first and second transistors MP1 and MN1 coupled in series is provided. Other types of inverters are also useful. The first transistor is a first type transistor while the second transistor is a second type. For example, the first type, comprises p-type and the second type comprises n-type. Providing n-type as the first type and p-type as the second type is also useful.

Gate terminals of the first and second terminals are commonly coupled to an input terminal 671 of the inverter; the common terminal of the inverter is coupled to an output terminal 672 of the inverter. The inverter input terminal is coupled to the gain portion input terminal IN and the inverter output terminal is coupled to the gain portion output terminal OUT.

In one embodiment, the inverter includes a third transistor MN0 coupled in series with the second inverter transistor. The gate terminal of the third transistor is coupled to an enable terminal EN of the gain portion. An active enable signal at the EN terminal activates the inverter portion. In one embodiment, the third transistor comprises an n-type transistor which would cause the inverter to be activated by a logic high EN signal. Providing a p-type third transistor is also useful.

A feedback sub-circuit 650 is provided. The feedback sub-circuit is coupled to the inverter input and output terminals. In one embodiment, the feedback sub-circuit comprises a resistor RF. Other types of feedback sub-circuits are also useful.

An OSCB 520 is provided to reduce a potential difference between the output and input terminals of the inverter circuit. In some embodiments, the OSCB reduces the magnitude of the potential difference to substantially zero. Reducing the magnitude of the potential difference to other values are also useful. In one embodiment, the OSCB comprises a transistor MN2. The transistor comprises, for example, an n-type transistor. Providing a p-type transistor is also useful. In one embodiment, a gate electrode 521 of MN2 is connected to the output terminal of the inverter whilst a source electrode 522 of MN2 is connected to the input terminal of the inverter circuit. A drain electrode 523 of MN2 is connected to the power supply $V_{dd}$.

The OSCB, in addition, also limits dynamically the peak amplitude of the oscillator output swing. For example, the peak amplitude of the oscillator is defined by $V_{gs}$ of MN2. $V_{gs}$ is strongly dependent on the threshold voltage of MN2 which does not change very much with the supply voltage. As such, varying the magnitude of power supply still maintains the peak amplitude within a narrow range. This feature is particularly useful in maintaining a high level of circuit performance under different values of power supply voltage level $V_{dd}$.

A current module 680 is included in the gain portion. In one embodiment, the current module comprises a current mirror formed by transistors MP_bias and MP0. The transistors of the current mirror, for example, are p-type transistors. Other types of transistors are also useful. The transistors comprise first, second and gate terminals.

In one embodiment, first terminals of the transistors are commonly coupled to the power supply $V_{dd}$. The gate terminals are commonly coupled to the second terminal of MP_bias. The second terminal of the MP0 is coupled in series to the transistors of the inverter. The first terminals, for example, are source terminals while the second terminals are drain terminals. A constant current $I_{sink}$ is provided at the second terminal of MP_bias.

The current module includes a bias current enhancer to improve the current sourcing capability. The bias current enhancer, in one embodiment, comprises transistors MN3 and MP3. As shown, MP3 is a p-type transistor and MN3 is an n-type transistor. Other types of transistors are also useful. A gate electrode of MP3 is connected to the input IN whilst a drain electrode of MP3 is connected to the output OUT. A source electrode of MP3 is connected to a source electrode of MN3; a drain electrode and a gate electrode of MN3 are connected to the gate electrode of MP_bias.

In operation, when the input IN switches from high to low, triggering the output OUT to switch from low to high, MP3 switches on and current is sourced at the output OUT from MP_bias through MN3 and MP3. In addition, current supplied from the power supply terminal $V_{dd}$ through MP0 and MP1 to output OUT also increases. This is because the increase in current through MP_bias is mirrored by an increase in current through MP0.

Thus, MN3 and MP3 are configured to increase the bias currents of MP0 and MP1 during current sourcing, as well as providing a current flowpath to the output OUT as described above.

In some embodiments of the invention, the current sourcing capability of the circuit may be made comparable to the current sinking capability by an appropriate choice of size of MN3 and MP3, whilst the transconductance of the inverter portion is still controlled by the fixed current bias to MP0 by MP_bias.

In one embodiment, a transistor MP2 is provided. MP2 functions to disable the crystal oscillator when EN signal is inactive. For example, when the EN signal is inactive, the gate of MP1 is pulled up to a logic 1, rendering it non-conductive.

Figure 7:
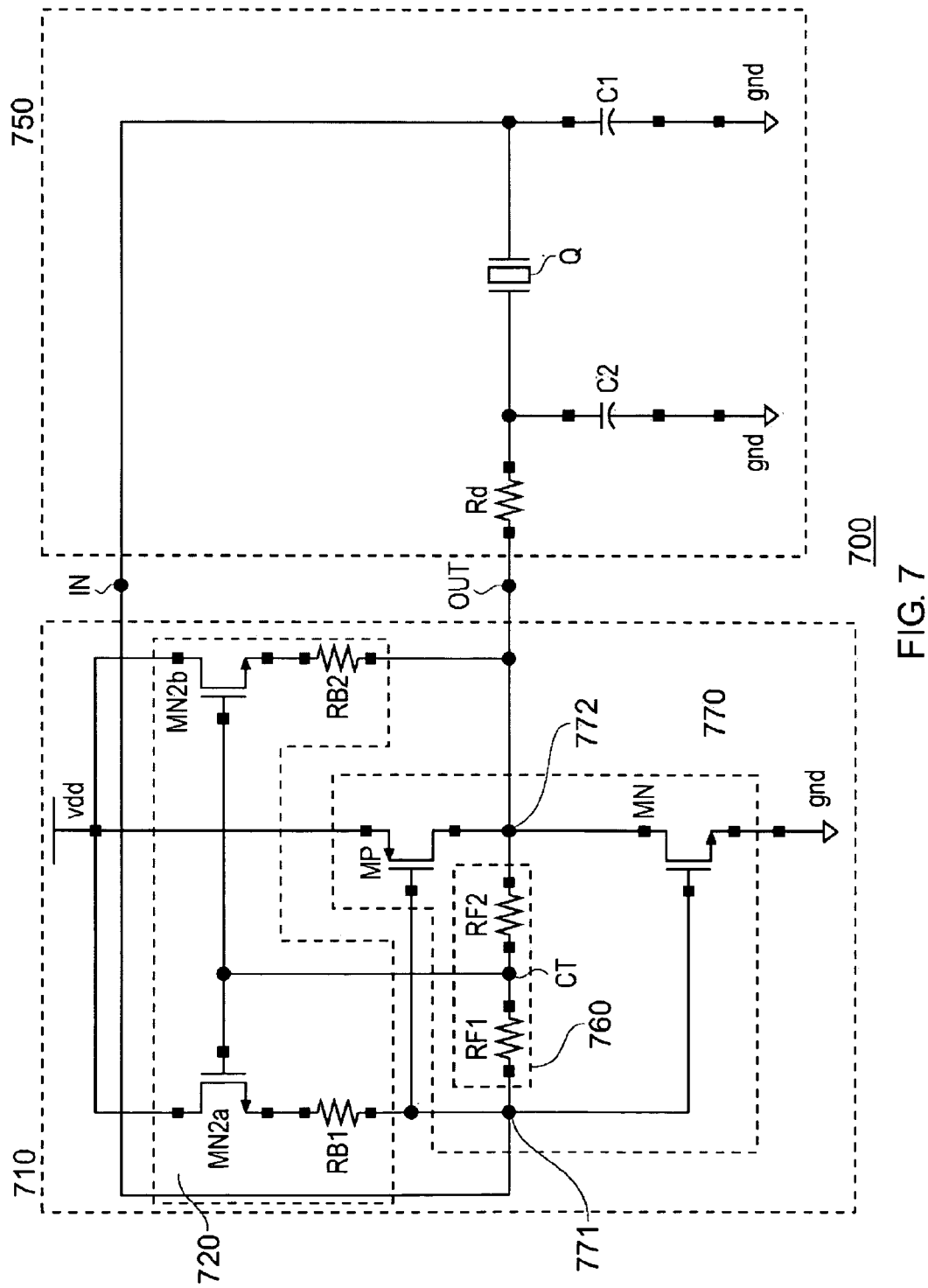
FIG. 7 is a schematic diagram of a crystal oscillator circuit having a gain portion according to an embodiment of the invention.

FIG. 7 shows an oscillator circuit 700 in accordance with another embodiment of the invention. The oscillator circuit, as shown, comprises a pi circuit 750 and a gain circuit or portion 710 coupled thereto. The pi circuit serves as a feedback circuit for the gain portion. In one embodiment, the pi circuit serves as external feedback of the gain portion. As shown, the pi circuit comprises a crystal Q, capacitors C1 and C2 and resistor $R_d$. Other types of pi circuits are also useful.

In one embodiment, the gain portion 710 comprises an inverter 770. The inverter, for example, comprises transistors MP and MN coupled in series between a power source $V_{dd}$ and ground gnd. MP is a p-type transistor while MN is an n-type transistor. Input terminal 771 of the inverter is coupled to the gate terminals of MP and MN while the output terminal 772 is coupled to the common terminal of MP and MN. The inverter input terminal is coupled to gain portion input terminal IN and the inverter output terminal is coupled to gain portion output terminal OUT.

A feedback subcircuit 760 is coupled to the inverter input and output terminals. In one embodiment, the feedback sub-circuit comprises first and second resistors RF1 and RF2. The sum of the resistances of the resistors is equal to the total feedback resistance. In one embodiment, resistances of RF1 and RF2 are equal. Providing RF1 and RF2 with unequal resistances is also useful.

An OSCB 720 is provided to reduce a potential difference between the output and input terminals of the inverter circuit. In some embodiments, the OSCB reduces the magnitude of the potential difference to substantially zero. Reducing the magnitude of the potential difference to other values are also useful.

As shown, the OSCB comprises first and second circuit paths. The first circuit path includes transistor MN2a coupled in series with a resistor RB1; the second circuit path includes transistor MN2b coupled in series with a resistor RB2. The transistors, for example, are n-type transistors. The drain terminals of the transistors are commonly coupled to the power supply $V_{dd}$ while the source terminals are coupled to the inverter input and output terminals via resistors RB1 and RB2. The gate terminals of the transistors are coupled to centre tap point (CT) of the feedback circuit. Thus, the CT is used to apply a bias potential to each of the transistors MN2a, MN2b.

Transistors MN2a and MN2b are provided to sense and compensate for dc offset effects. Additionally, the transistors serve to limit the peak amplitude of the oscillator output swing (being the potential difference between the input IN and output OUT). This feature is particularly useful when the value of the supply voltage $V_{dd}$ is expected to vary over a wide range since it allows a relatively stable output in terms of signal amplitude to be obtained.

By way of example, $V_{dd}$ may be in the range of 1.2V (+/−10%), 1.8V (+/−10%), even 2.5V (+/−10%) and a relatively constant output swing generated between the input IN and output OUT terminals. If no mechanism were introduced by which the output swing could be limited, the corresponding output swing of the oscillator could follow the variation in $V_{dd}$.

Transistors MN2a and MN2b in combination with resistors RB1 and RB2 increase the impedance of the input IN. Consequently, negative resistance is provided by the on-chip gain portion 710 even when leakage current $I_{leak}$ into the output OUT is relatively large. Without RB1 and RB2, the input impedance is reduced when the leakage current is significant. This in turn affects the negative resistance that the amplifying circuit is intended to provide, with the amount of negative resistance being reduced. In some such cases, negative resistance is no longer obtained.

Thus, the inclusion of RB1 and RB2 allows negative resistance to be obtained even for relatively large values of leakage current.

In some embodiments, the presence of transistors MN2a and MN2b in combination with resistors RB1 and RB2 allow stable oscillation to be obtained at larger values of leakage current than in some embodiments according to FIG. 4 and FIG. 6

Some embodiments of the invention have the advantage that a dc offset potential difference between an input IN and an output OUT of an inverter of an oscillator circuit may be reduced. Thus, the deleterious effects of leakage current due to the presence of ESD protection devices connected to an input IN of the inverter may be at least partially mitigated.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics or groups described in conjunction with a particular aspect, embodiment or example of the invention are to be understood to be applicable to any other aspect, embodiment or example described herein unless incompatible therewith.

What is claimed is:

1. A gain circuit of an oscillator circuit comprising:
an inverter portion having an input IN and an output OUT arranged for connection to an external feedback circuit comprising a pi network, said inverter portion having a first gain element and a second gain element coupled in series with third and fourth gain elements, said third gain element being provided between a power supply line and said first gain element, said fourth gain element being provided between said second gain element and ground gnd;
a feedback member comprising a first resistive element coupled between said input IN and said output OUT; and
an offset sense and correction block (OSCB) configured to detect a dc offset potential difference between said input IN and output OUT, said OSCB being further configured to supply a current to said input IN when the dc offset potential difference between the input IN and output OUT is detected to reduce the dc offset potential difference.

2. A circuit as claimed in claim 1, wherein said OSCB includes a first MOSFET, a gate of said first MOSFET being coupled to said output OUT and a first current electrode of said first MOSFET being coupled to said input IN.

3. A circuit as claimed in claim 2 wherein said first MOSFET is a first NFET device and said first current electrode is a source electrode.

4. A circuit as claimed in claim 1 wherein said first gain element and second gain element are coupled in series via said output OUT, said first and second gain elements having a gate coupled to said input IN, wherein
a source electrode of said first gain element is coupled to the power supply terminal $V_{dd}$ and a source electrode of said second gain element is coupled to the ground terminal gnd; and
drain electrodes of said first and second gain elements are coupled to said output OUT.

5. A gain circuit of an oscillator circuit comprising:
an inverter portion having an input IN and an output OUT arranged for connection to an external feedback circuit comprising a pi network; and
a feedback member comprising a first resistive element coupled between said input IN and said output OUT;
the circuit further comprising an offset sense and correction block (OSCB) configured to detect a dc offset potential difference between said input IN and output OUT, said OSCB being further configured to reduce said offset potential by supplying a current to said input IN;
wherein said OSCB includes a first MOSFET, a gate of said first MOSFET being coupled to said output OUT and a first current electrode of said first MOSFET being coupled to said input IN; and
wherein said feedback member further comprises a second resistive element coupled in series with said first resistive element at a divider junction, said gate of said first MOSFET being coupled to said divider junction whereby said gate is coupled to said output OUT by said second resistive element.

6. A circuit as claimed in claim 5 wherein said OSCB further comprises a second MOSFET, a gate of said second MOSFET being coupled to said gate of said first MOSFET, a first current electrode of said second MOSFET being coupled to said output OUT.

7. A circuit as claimed in claim 6 wherein said first current electrode of each of said first and second MOSFETs of said OSCB are coupled to said input IN and output OUT, respectively, by means of respective third and fourth resistive elements, whereby an impedance of said input IN is increased.

8. A circuit as claimed in claim 7, wherein said first and second MOSFETs are NFET devices and said first current electrode of each of said devices is a source electrode.

9. A circuit as claimed in claim 8 wherein a drain electrode of each of said first and second MOSFETs are coupled to a power supply line.

10. A circuit as claimed in claim 4 further comprising a supplementary current portion arranged to provide a supplementary current at said inverter output OUT when said inverter output is in a high condition.

11. A circuit as claimed in claim 10 wherein said supplementary current portion is further configured to increase a current provided to said output OUT by said inverter portion.

12. A gain circuit of an oscillator circuit comprising:
an inverter portion having an input IN and an output OUT arranged for connection to an external feedback circuit comprising a pi network, the inverter portion comprises a first gain element and a second gain element coupled in series via the output OUT, the first and second gain elements having a gate coupled to the input IN, wherein a source electrode of the first gain element is coupled to a power supply terminal $V_{dd}$ and a source electrode of the second gain element is coupled to a ground terminal gnd, and drain electrodes of the first and second gain elements are coupled to the output OUT, and wherein the first and second gain elements of the inverter portion are coupled in series with third and fourth gain elements, the third gain element being provided between a power supply line and the first gain element, the fourth gain element being provided between the second gain element and ground gnd;
a supplementary current portion arranged to provide a supplementary current to the inverter output OUT when the inverter output is in a high condition, wherein the supplemental current portion increases a current a provided to the output OUT by the inverter portion to increase the current at the output OUT;
a feedback member comprising a first resistive element coupled between the input IN and the output OUT; and
an offset sense and correction block (OSCB) configured to detect a dc offset potential difference between the input IN and output OUT, the OSCB being further configured to supply a current to the input IN when the dc offset potential difference between the input IN and output OUT is detected to reduce the dc offset potential difference.

13. A circuit as claimed in claim 12 wherein said third gain element is connected in a current mirror configuration with a bias gain element, said bias gain element being coupled to a current sink $I_{sink}$.

14. A circuit as claimed in claim 13 wherein said supplementary current portion comprises a first supplementary gain element having a gate electrode coupled to said input IN, a first current electrode coupled to said current sink $I_{sink}$ and a second current electrode coupled to said output OUT.

15. A circuit as claimed in claim 14 wherein said first supplementary gain element is coupled to said current sink $I_{sink}$ via a second supplementary gain element, a first current electrode of said second supplementary gain element being coupled to said second electrode of said first supplementary gain element and a gate electrode and a second current electrode of said second supplementary gain element being coupled to said current source $I_{sink}$.

16. A circuit as claimed in claim 15 wherein said bias gain element comprises a PFET device having a source electrode coupled to said power supply line, and gate and drain electrodes coupled to said current sink $I_{sink}$, said gate electrodes of said third gain element and second supplementary gain element being coupled to said gate electrode of said bias gain element.

17. A circuit as claimed in claim 16 wherein said third gain element is a PFET device and said fourth gain element is an NFET device.

18. A circuit as claimed in claim 17 wherein said first supplementary gain element is a PFET device and said second supplementary gain element is an NFET device, said first current electrodes of said devices being source electrodes, said second current electrodes of said devices being drain electrodes.

19. A circuit as claimed in claim 1 comprised in an integrated circuit device.

20. A circuit as claimed in claim 1 wherein at least one selected from amongst said input IN and output OUT is connected to an electrostatic discharge device.

21. An integrated circuit having at least a portion comprising a gain circuit, said gain circuit comprising:
an inverter portion having an input IN and an output OUT arranged for connection to an external feedback circuit comprising a pi network thereby to form an oscillator circuit, said inverter portion comprising a PFET device and an NFET device coupled in series via said output OUT, a source electrode of said PFET device being coupled to a first power supply terminal, a source electrode of said NFET device being coupled to a second power supply terminal and drain electrodes of said devices being coupled to said output OUT, wherein said inverter portion further comprises a second PFET device coupled in series to the PFET device between the PFET device and the first power supply terminal and a second NFET device coupled in series to the NFET device between the NFET device and the second power supply terminal; and
a feedback portion comprising a resistive portion coupled between said input IN and said output OUT,
said circuit further comprising an offset sense and correction block (OSCB) configured to detect a dc offset potential difference between said input IN and output OUT, said OSCB being further configured to reduce said dc offset potential by supplying a current to said input IN,
wherein said OSCB comprises an NFET device, a gate of said NFET device being coupled to said output OUT and a source electrode of said NFET device being coupled to said input IN.

22. A method of controlling a gain circuit of an oscillator circuit, said gain circuit having an input IN and an output OUT arranged for connection to a feedback circuit comprising a pi network, said circuit further comprising a feedback member coupled between said input IN and output OUT and a first MOSFET device having a gate electrode coupled to said output OUT, said method comprising said steps of:
detecting a dc offset potential difference between said input IN and output OUT; and supplying a current to said inverter input IN when the dc offset potential difference between the input IN and output OUT is detected to reduce the dc offset potential difference, wherein said feedback member comprises a first resistive element coupled between said input IN and said output OUT and a second resistive element coupled in series with said first resistive element at a divider junction, and wherein said gate electrode of said first MOSFET device is coupled to said divider junction and to said output OUT by the second resistive element.

23. A method as claimed in claim 22 wherein said gain circuit further includes a second MOSFET having a gate electrode coupled to said gate electrode of said first MOSFET and a first current electrode being coupled to said output OUT.

24. A method as claimed in claim 22 wherein said first MOSFET device has a first current electrode coupled to said input IN thereby to detect said dc offset and supply said current to said input IN.

25. A gain circuit comprising:
an input IN terminal;
an output OUT terminal;
an inverter having an input and output terminals coupled to the IN and OUT terminals, said inverter comprising a PFET device and an NFET device coupled in series via the output terminal, a source electrode of said PFET device being coupled to a first power supply terminal via a second PFET device, a source electrode of said NFET device being coupled to a second power supply terminal via a second NEFT device and drain electrodes of said devices being coupled to said output terminal; and
an offset sense and correction block (OSCB) coupled to the inverter, wherein the OSCB reduces a detected potential difference between the IN and OUT terminals by supplying a current to the IN terminal.

* * * * *